United States Patent [19]

Brémon et al.

[11] 4,213,107
[45] Jul. 15, 1980

[54] ELECTRO-MECHANICAL FILTER

[75] Inventors: Christian Brémon, Clamart; Anne Grannec, Paris; Rémy Pery, Saint Jean le Blanc; Joël Philippe, Orleans, all of France

[73] Assignee: Compagnie Industrielle des Telecommunications Cit-Alcatel, Paris, France

[21] Appl. No.: 8,198

[22] Filed: Jan. 31, 1979

[30] Foreign Application Priority Data

Feb. 10, 1978 [FR] France ................ 78 03792

[51] Int. Cl.$^2$ .................. H03H 9/24; H03H 9/26; H03H 9/00
[52] U.S. Cl. ................................ 333/197; 333/187
[58] Field of Search .............. 333/186, 141–145, 333/197–201

[56] References Cited

U.S. PATENT DOCUMENTS 4,130,812  12/1978  Berniere ....................... 333/197

FOREIGN PATENT DOCUMENTS 2152133  4/1973  France .
2304217  10/1976  France .

Primary Examiner—Alfred E. Smith
Assistant Examiner—Marvin Nussbaum
Attorney, Agent, or Firm—Sughrue, Rothwell, Mion, Zinn and Macpeak

[57] ABSTRACT

An electro-mechanical filter comprises an inlet electro-mechanical transducer (12) an outlet electro-mechanical transducer (14) and a mechanical filter constituted by a series connection of resonator bars (1 to 11) which are interconnected by couplers (20 to 29). The bars are half a wavelength long at the central frequency of the pass-band while the couplers are one-quarter of a wavelength long. Instead of being connected to the ends of the bars, the couplers are connected to recessed stepped flats (40) located near the ends of the bars. The positions of the flats (40) are determined to be close to nodes in the first few orders of partials in bending mode vibration of the bars. This has the effect of greatly attenuating the excitation of such parasitic bending modes of vibration. Clearance to enable the couplers to reach the flat (40) is provided by a more deeply stepped positioned flat (41) extending to the end of the rod. Such filters may be used in terminals for analogue transmission systems.

3 Claims, 4 Drawing Figures

ELECTRO-MECHANICAL FILTER

FIELD OF THE INVENTION

The present invention relates to electro-mechanical filters and in particular to electro-mechanical frequency pass-band filters intended for use in terminal equipments in analogue carrier-wave transmission systems. Advantageously, these filters may constitute the filters in the premodulation circuits of multiplex equipments; they are particularly adapted to twelve channel multiplex equipments using a single premodulation carrier, e.g. 128 kHz, or using several premodulation carriers, e.g. three carriers at 124, 128 and 132 kHz respectively.

BACKGROUND OF THE INVENTION

In known manner, an electro-mechanical filter is composed of a mechanical filter formed by a series of resonators interconnected by couplers, together with an electro-mechanical inlet transducer and an electro-mechanical outlet transducer which are both connected to the mechanical filter by couplers. The electro-mechanical transducers transform electric currents into mechanical vibrations or perform the inverse transformation. In a mechanical filter the resonators and the couplers are metal bars, are generally cylindrical, and have defined length and section or diameter, with the couplers being of a smaller diameter than the resonators. More precisely, in a mechanical filter using longitudinally vibrating filters and couplers which likewise vibrate longitudinally, (which is the type of mechanical filter used in the present invention), the resonators in general have a length corresponding substantially to a half wavelength of the chosen resonant frequency and the couplers in general have a length corresponding to a quarter wavelength of the resonant frequency. The diameters of the resonators and of the couplers are likewise precisely defined in order to obtain desired coupling coefficients between the resonators, the coupling coefficient between two cylindrical resonators connected by a cylindrical coupler being proportional to $Z_c/\sqrt{Z_{r1} \cdot Z_{r2}}$ and consequently to $D_c^2/(D_{r1} \cdot D_{r2})$, where $Z_c$, $Z_{r1}$ and $Z_{r2}$ are the impedances of the coupler and the two resonators in question, and where $D_c$, $D_{r1}$ and $D_{r2}$ are their diameters whose squares are proportional to the respective impedences. The different desired coupling coefficients can thus be obtained by using resonators of the same diameter and couplers of different diameters, or by using resonators of different diameters and couplers of the same diameter.

Realizations of electro-mechanical frequency pass-band filters can thus be arrived at in which the central frequency of the pass-band is defined by the resonant frequency of the resonators.

Frequency pass-band electro-mechanical filters thus realised, while satisfactory in the pass band, nonetheless presents several drawbacks due in particular to the existence of parasitic modes of vibration which may occupy the pass-band or the attenuated bands of the filter. These modes are essentially bending modes.

The parasitic modes of bending vibration in the resonators and the couplers are a function of the diameters of the resonators and the couplers. It is possible to shift the frequency position of the parasitic modes and thereby move them out of the pass-band of the filter by changing the diameters of the resonators and the couplers. Thus in practice the diameters of the resonators and the filters are chosen in such a way as to satisfy essentially two requirements: firstly, to obtain the desired coupling coefficients between resonators; and secondly, to put the parasitic bending mode vibrations into frequency zones in which they will be of no or little nuisance. In the corresponding filter realizations, the parasitic modes are then positioned outside the pass-band of the filter, however, since the level of these parasitic modes remains unchanged, the unwanted effects of the unattenuated parasitic modes are not always completely and certainly avoided.

The present invention makes it possible to reduce the side effects of the parasitic oscillations, even in cases where it is not certain that they are totally eliminated.

SUMMARY OF THE INVENTION

The present invention provides an electro-mechanical frequency band-pass filter comprising an inlet electro-mechanical transducer, an outlet electro-mechanical transducer and a mechanical filter. The said mechanical filter comprises a set of resonators, each vibrating longitudinally at a half wavelength of the central frequency of the filter, and a set of couplers, connecting the resonators to each other and to the inlet and outlet transducers, each vibrating longitudinally at a quarter wavelength of the central frequency of the filter. Each coupler is fixed to a first stepped flat in the surface of the corresponding resonator, the flat being formed near to one of the ends of the resonator and at the level of a node point in bending vibration of the resonator, and wherein the resonator has a second stepped flat which is adjacent to the first and which extends to the face of the said near end of the resonator, the second flat forming a deeper step in the surface of the resonator than that formed by the said first flat.

An electro-mechanical filter embodying the invention is described by way of example with reference to the accompanying drawings.

DESCRIPTION OF THE PREFERRED EMBODIMENT

Figure 1:
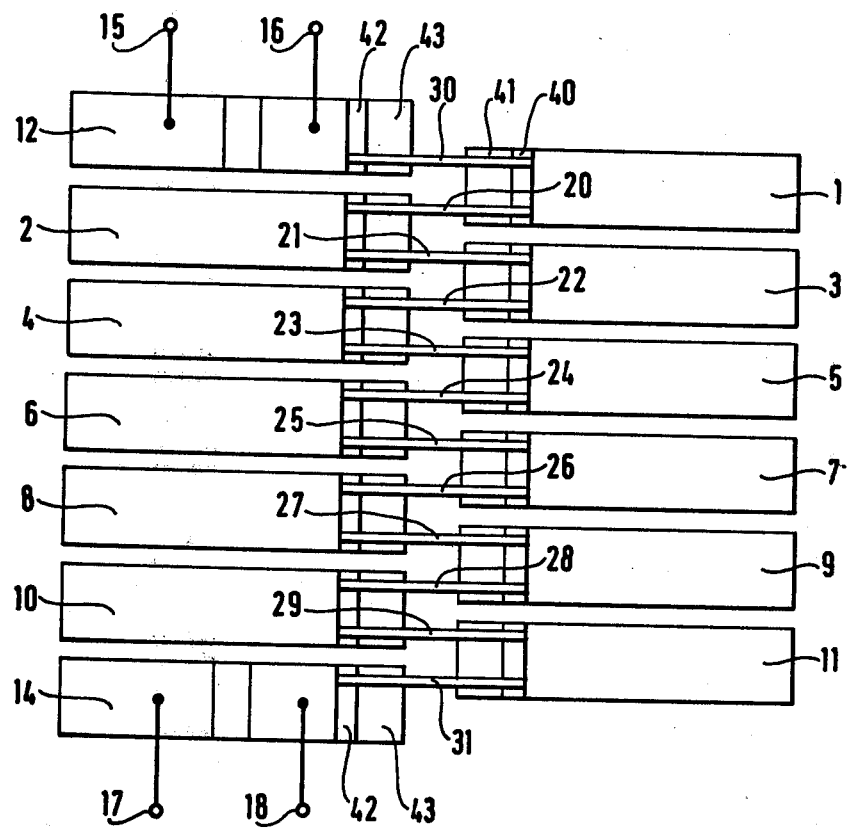
FIG. 1 is a plan view which shows an electro-mechanical filter in accordance with the invention.

The electro-mechanical filter shown in FIG. 1 is constituted by eleven cylindrical resonators designated 1 to 11 and interconnected by ten couplers 20 to 29, likewise cylindrical in shape. The resonators are disposed in two rows, one of the rows comprising five resonators and the other six resonators. The axes of the resonators in the two rows are parallel. Each of the ten couplers 20 to 29 connects a resonator in one of the rows to the following resonator in the other row; the axes of the couplers are parallel to each other and to the axes of the resonators. The two end resonators 1 and 11 are in the six-resonator row and one of them is coupled to an inlet electro-mechanical transducer 12 while the other is coupled to an outlet electro-mechanical transducer 14 via respective couplers 30 and 31 analogous to the couplers 20 and 29. These inlet and outlet electromechanical transducers 12 and 14 are provided with electrical terminals 15–16 and 17–18 respectively.

Figure 2:
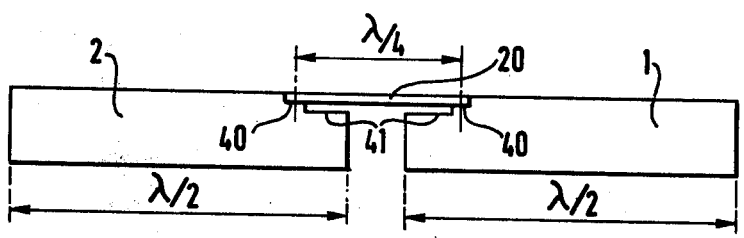
FIG. 2 is a side elevational view which shows two resonators of the filter of FIG. 1 connected by a coupler.
Figure 3:
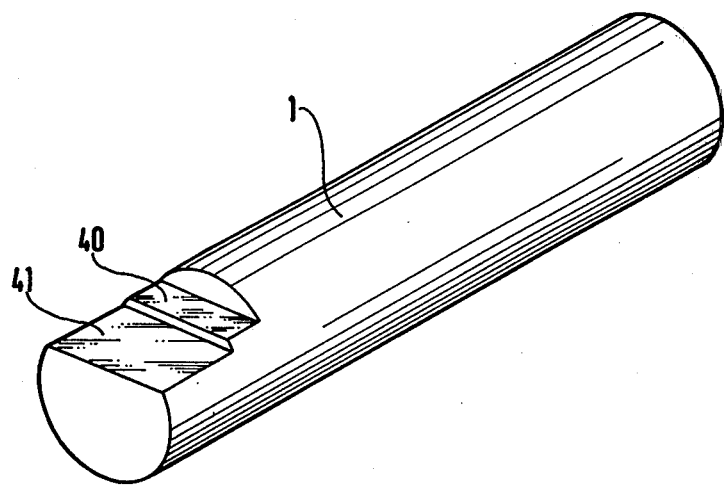
FIG. 3 is a perspective view of a filter resonator in accordance with the invention.
Figure 4:
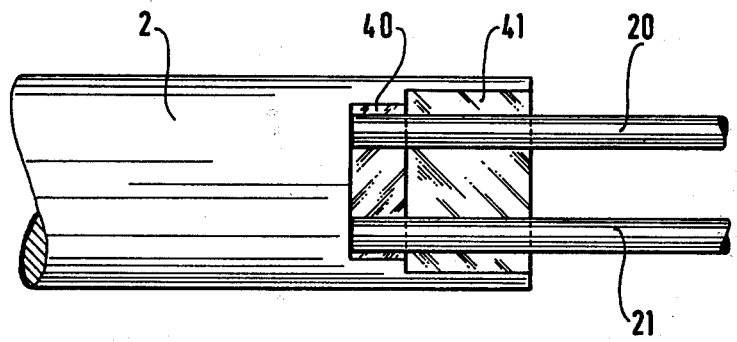
FIG. 4 shows, to a larger scale than FIG. 1, the end of a resonator to which the ends of two couplers are fixed.

As appears clearly from looking at FIGS. 1 to 4, and more particularly, FIGS. 3 and 4, the coupler-receiving end of each resonator is, in accordance with the invention, machined in a particular manner. In FIG. 2 which shows the coupling between two resonators, e.g. resonators 1 and 2; in FIG. 3 which shows a resonator, e.g. the resonator 1; and in FIG. 4 which shows the end of a resonator, e.g. the resonator 2 together with the couplers 20 and 21 which are fixed thereto; it can be seen that each resonator is provided adjacent its coupler-receiving end with a first stepped flat 40 and a second stepped flat 41 adjacent to the first and formed at the end of the resonator where it meets its front face. The levels of the two flats 40 and 41 are staggered: with the flat 41 extending deeper into the resonator than the flat 40 and being stepped relative thereto. The first flat 40 defines a fixing zone for receiving the end of each of the couplers: the end of each of these couplers rests on practically the entire length of the flat 40. The second flat 41 avoids any contact, other than that sought on the zone defined by the flat 40, between the resonator and the two couplers in question. The end of each of the couplers is fixed to the flat 40 at the level of a bending node-point of the resonator, preferably by electric welding which has the effect (not shown) of flattening the ends of the couplers. This flattening improves the mechanical behaviour of the couplers and the resonator, and thus of the assembly of filter elements.

In the electro-mechanical filter illustrated in FIG. 1, the inlet and outlet tranducers 12 and 14 are preferably integrated piezoelectric tranducers e.g. Langevin tranducers. They act as inlet and outlet resonators and they are disposed in the resonator rows, in this case they are both in the row which includes five resonators. That end of each of the transducers which is situated towards the interior of the two rows is machined in the same manner as the inner ends of the resonators in the two rows. Each end has the same two staggered or stepped flats designated by the references 42 and 43 for the transducers. The flat 42 defines the fixing zones for the end of the coupler 30 or 31 which connects the transducer to its corresponding resonator terminal.

The composition of an electro-mechanical Chebyshev type filter comprising thirteen resonators and including inlet and outlet tranducers is described below by way of example: the pass-band extends from 128 to 132 kHz. The different coupling co-efficients between the thirteen successive resonators are determined as a function of the chosen pass-band ripple by using the well-known method of calculating the successive elements of the corresponding prototype Chebyshev low-pass filter, (for example see Weinberg's "NETWORK ANALYSIS AND SYNTHESIS" published by McGraw-Hill Book Company Inc., 1962). For a structure as shown in FIG. 1, where the resonator axes are parallel with the coupler axes, the values of the coupling coefficients define the ratio between the diameter of each coupler and the diameters of the resonators coupled thereby, to within an accuracy of a constant coefficient which is determined by the resonator and coupler material(s).

The diameters of the resonators are then calculated in such a way that the frequencies of parasitic oscillations (in this case second and third order partials of bending vibration which are situated on either side of the pass band of the filter) are situated as far as possible from the filter pass band and are thus located in the frequency zones where they are of little nuisance. The diameters of the resonators and the couplers are then calculated in such a way that their ratios define the said coupling coefficients to within the accuracy of the abovementioned coefficient. One can thus arrive, for example, at resonators having the same diameter and couplers having different diameters.

Thus, by way of example, resonators having a diameter of 4 mm can be defined so that the frequencies of the different partials of bending vibration are situated at about 100 kHz for the second order partial and at about 160 kHz for the third order partial, while the first order partial is situated at about 50 kHz. The diameters of the different couplers are then defined in such a manner as to obtain the previously determined coupling coefficients.

It is also possible to arrive at resonators having different diameters and couplers of the same diameter.

The lengths of the resonators is defined elsewhere: the length of each resonator is substantially equal to the half wavelength of the central frequency of the filter.

The positions along the resonators of the nodes of bending vibration are determined in such a manner that the end of each coupler is fixed on each resonator near to the end of the resonator at a node point of the most inconvenient of the bending partials. The positions of the nodes of bending vibrations are therefore calculated for the first, second and third partials; the amplitude of the higher order partials being negligible in comparison to the first three. The positions $v$ of these bending vibration nodes can be obtained by solving equations drawn from the methods of calculation described in many works on mechanics which deal with vibrations in solids (e.g. see the following works; Shock and vibration handbook—Harris and Crede—McGraw-Hill; Théorie des vibrations—Timoshenko—Librairie Polytechnique Béranger; Vibration problems in engineering Timoshenko—D. H. Young and W. Weaver—Wiley; Théorie de l'élasticité—Timoshenko—Librairie Polytechnique Béranger). Thus in the present example of thirteen resonators having a diameter of 4 mm and a length of 18.2 mm, the different values of $v$ as a function of the order of the partial, are given in the following table, in which the front face of the resonator adjacent to the flat 41 in FIG. 3 is taken as the origin:

| Partial n° | $v$ mm |
| --- | --- |
| 1 | 4.20 |
| 2 | 2.64 |
| 3 | 2.00 |

This table only indicates, for each partial, the position of the node at which the flat 40 of FIG. 3 is machined.

Once the lengths and diameters of the resonators and of the couplers are thus defined, and once the positions of the bending node points for the first, second and third partials have also been defined, the lengths of the two steps or flats 40 and 41 of each resonator are defined in such a manner that the bending node points for the second and third partials are situated at the flat 40.

The depths of the steps formed in each resonator to constituted the flat 40 and 41 are also defined. The depth of the step defining the flat 40 is chosen to be 0.7 mm and that of the step defining the flat 41 is chosen to be 1.1 mm.

The machining of these steps at one of the ends of each resonator modifies the characteristics of the filter, and in particular the coupling coefficients between the resonators and the couplers. The dimensions calculated above are thus only theoretical and the real diameter which each resonator ought to have is modified experimentally in such a way that the desired coupling coefficients are substantially retained. The results of experiments performed by the Applicant have led to the use of resonators having a diameter of 3.7 mm instead of the 4 mm diameter calculated for un-stepped resonators, thereby compensating for the effect of the two steps.

The making of the steps and the changed diameter of the resonators changes the positions of the bending nodes with respect to the results of the initial calculation. For each coupler the positions of the points at which its ends are welded to the flats 40 of the two resonators to which it is connected, are determined in such a manner that the wel-points are centred or are very substantially centred at the level of the bending node points for the second and third order partials of the resonators. In the example described, the flats 40 have a length of 1 mm and the flats 41 have a length of 2.4 mm. The weld-points connecting the ends of a single coupler to the two resonators concerned are separated from each other by a distance corresponding to a quarter wavelength at the central frequency of the filter.

There thus arises a structure in which the couplers rest only on the flats 40 of the resonators and are connected to the resonators by weld-points which are situated substantially at the level of the nodes of bending vibration. Each of the resonators is thus connected to the coupler concerned at a bending node point, (or close to a bending node point) and is thus not excited for bending. The parasitic modes of vibration which this mode of excitation gives rise to are thereby eliminated, or at least considerably reduced.

Further, since the connections between the couplers and the resonators are made on the flats 40 and not at the ends of the resonators as in a conventional structure, the structure in accordance with the invention has the advantage of being less bulky. Indeed, assuming that the weld-points of the couplers on the resonators are in the middle of the flats 40, the width of the filter is $\lambda/2+\lambda/4+\lambda/2-(2a+b)$, where $\lambda$ is the wavelength of the central frequency of the filter, a is the length of a flat 41, and b the length of each flat 40. The width of a filter of the conventional structure mentioned above would be $\lambda/2+\lambda/4+\lambda/2$.

Another advantage stemming from the filter structure described lies in the fact that it enables several different filters to be realised from the same basic components, i.e. by using resonators and couplers whose diameters are not changed from one filter to the next. To change the design from one filter to another, the only modifications required of the resonators and the couplers concern their lengths: the lengths of the resonators are designed to resonate at the central frequency of the filter and the lengths of the couplers are designed so that the distance separating the two points connecting each coupler to the resonators which it couples is equal to a quarter wavelength of the same frequency. Tests performed by the applicants have shown that a suitable choice for the length of a flat 40 and for the length of the flat 41 together with the choice of position for the weld-points between the couplers and the resonators makes it possible to obtain a second band-pass filter whose central frequency is shifted with respect to that of the first and whose electrical response is satisfactory, merely by using resonators and couplers of different lengths.

The use of different filters is necessary in frequency multiplex systems for constituting three initial subgroups when building up a frequency range grouping twelve channels from the channels which are premodulated on three separate carriers $F_1$, $F_2$, $F_3$. Thus, for example, three band-pass filters having the ranges 124–128 kHz, 128–132 kHz and 132–136 kHz respectively can be realised using the same basic components, designed initially, as above, for the 128–132 kHz filter. The lengths of the resonators and of the couplers for each of the filters is different, the lengths of the resonators and of the couplers for the 124–128 kHz filter and the 132–136 kHz filter differing by $+3\%$ and $-3\%$ respectively from the lengths of the resonators and the couplers of the 128–132 kHz filter.

Now, the coupling coefficients of the 124–128 kHz filter and the 132–136 kHz filter need to be shifted by the same amount, i.e. $+3\%$ and $-3\%$ respectively, with respect to those of the 128–132 kHz filter. Hence the prior art designs use resonators and couplers of different diameters as well as of different lengths for the different filters. However, experiments performed by the Applicant have shown that variation in the lengths of the flats 41 together with the positions of weld-points on the flats 40 causes variation in the coupling coefficients between the components concerned. It is thus possible to draw a set of curves which show these variations in coupling coefficient as a function of the ratio of the length of the flat 41 to the overall length of the resonator for various connection positions of the coupler on the resonator. This set of curves makes it possible to deduce conditions under which a given variation in length (i.e.; $\pm 3\%$ in this case) to the un-stepped end of the resonator causes a corresponding variation in the coupling coefficient by virtue of the percentage change in the length of the flat 41 when the overall length is changed. Thus in practical design terms, the desired resonator shape (diameter, overall length, length of the flats) is determined for the middle range filter and then a series of identical resonator components are made with $+3\%$ overall length. Some of these components are used as such for the low frequency range filter, others are machined down by 3% to arrive at the design conditions for the middle frequency range filter, and the remainder are machined down by a further 3% for the high frequency range filter. The couplers are likewise all initially made for the low frequency range filter and some are then adjusted to the lengths required for the other filters. The points of connection between the couplers and the resonators remain in all cases close to the bending node points of the resonators: the electrical response of each of the three filters thus realised remains satisfactory and even though the positions of the connection points are not always optimal, the parasitic bending modes generated thereby remain considerably attenuated.

We claim:

1. An electro-mechanical frequency band-pass filter comprising an inlet electro-mechanical transducer, an outlet electro-mechanical transducer and a mechanical filter, said mechanical filter comprises a set of resonators, each vibrating longitudinally at a half wavelength of the central frequency of the filter, and a set of couplers, connecting the resonators to each other and to the inlet and outlet transducers, each vibrating longitudinally at a quarter wavelength of the central frequency of the filter, the improvement wherein each coupler is fixed to a first recessed, stepped flat in the surface of the corresponding resonator, said first recessed flat being formed near one of the ends of the resonator and at the level of a node point in bending vibration of the resonator, and wherein the resonator has a second recessed, stepped flat which is adjacent to the first flat and extends to the face of said near end of the resonator, and said second flat forming a deeper step in the surface of the resonator than that formed by said first flat.

2. An electro-mechanical filter according to claim 1, wherein the end of each coupler rests substantially over the whole length of the said first flat in the surface of the corresponding resonators and is fixed thereto by a connection point situated substantially at the level of the said node point in bending vibration of the resonator.

3. An electro-mechanical filter according to claim 2, wherein the distance separating the connection points of a coupler to the two resonators to which it is connected is substantially equal to a quarter wavelength of the central frequency of the filter in the coupler.

* * * * *